United States Patent [19]
Ochiai

[11] 3,955,151
[45] May 4, 1976

[54] AMPLIFIER WITH A PLURALITY OF NEGATIVE FEEDBACK CIRCUITS

[75] Inventor: Yoshio Ochiai, Yokosuka, Japan

[73] Assignee: Sony Corporation, Tokyo, Japan

[22] Filed: Nov. 18, 1974

[21] Appl. No.: 524,958

[30] Foreign Application Priority Data
Nov. 24, 1973 Japan............................ 48-135581

[52] U.S. Cl.............................. 330/107; 330/51; 330/103; 330/110
[51] Int. Cl.² ........................................ H03F 1/36
[58] Field of Search ............... 330/28, 51, 103, 107, 330/109, 110; 179/1 A, 1 D, 1 F

[56] References Cited
OTHER PUBLICATIONS

Burrows, "Ceramic Pickups and Transistor Bre-Amplifiers", Wireless World, Feb. 1970, pp. 56–60, 80.

Rose, "Simplified Design of Feedback Equalizers", Radio & Television News, Sept. 1954, pp. 54–57, 156, 157.

Primary Examiner—James B. Mullins
Attorney, Agent, or Firm—Hill, Gross, Simpson, Van Santen, Steadman, Chiara & Simpson

[57] ABSTRACT

An amplifier is disclosed which may selectively be connected to different input circuits and which is provided with a plurality of switchable negative feedback impedance networks. A feedback attenuation impedance is provided which prevents oscillation of the amplifier triggered by positive feedback through switch leakage resistance between switch contacts. The attenuation impedance lower the loop again in the circuit formed by the amplifier, leakage resistance and disconnected feedback impedance by lowering the loop gain below the oscillation point.

9 Claims, 2 Drawing Figures

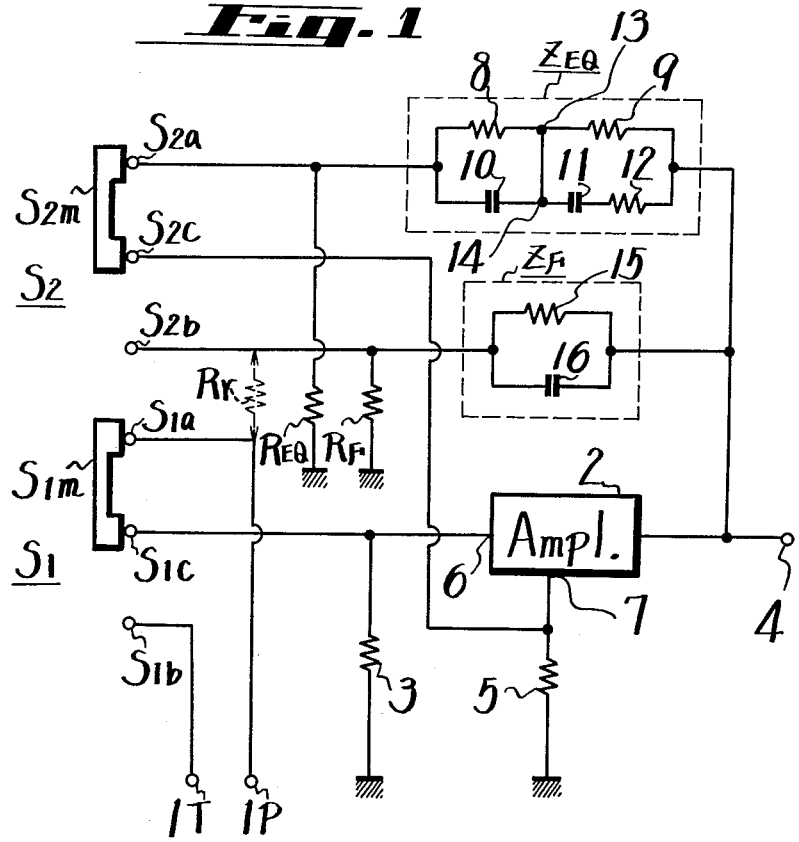
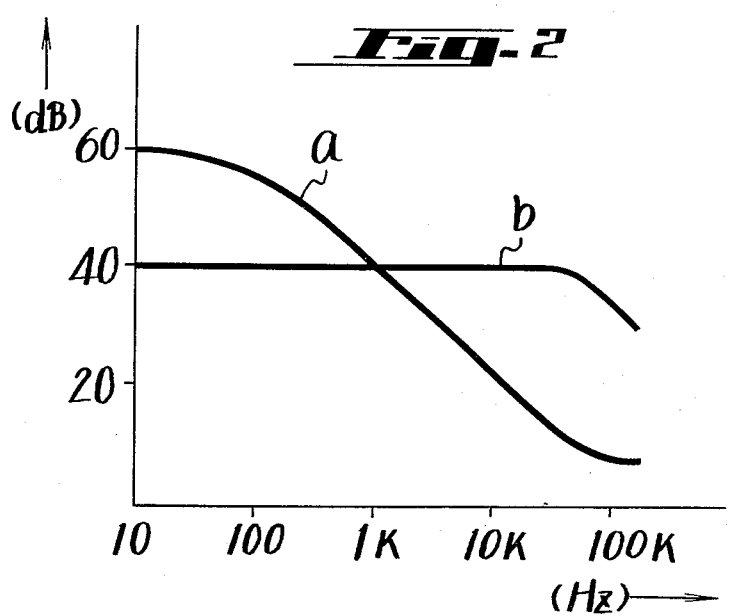

AMPLIFIER WITH A PLURALITY OF NEGATIVE FEEDBACK CIRCUITS

BACKGROUND OF THE INVENTION

1. Field of the Invention

The present invention relates generally to an amplifier which is connectable to a selected one of a plurality of input circuits through a selected one of a plurality of negative feedback circuits, and more particularly is directed to an amplifier with switchable inputs and feedback circuits.

2. Description of the Prior Art

In the art, an amplifier having negative feedback is employed for high gain. In such a prior art negative feedback amplifier, an output signal from a phonograph or an output signal from a stereo-tuner is selected as a signal source by a signal switch. The amplifier is used to obtain necessary amplification for the respective input signals and to control the frequency characteristic of a phonograph output signal in accordance with pre-emphasis characteristics and de-emphasis characteristics (RIAA-characteristics) during recording. A feedback switch is used to connect a phono feedback circuit with a pre-emphasis frequency response to the amplifier to obtain a flat signal at the output of the amplifier when a phono input is used. A feedback circuit for the stereo-tuner output signal is simultaneously opened.

In the prior art there is a fear that oscillations will occur resulting from positive feedback to the amplifier input by a leakage resistance existing between the contacts of the feedback switch and the signal switch, the contacts of each switch being near each other in a function selector. For this reason, prior art circuits require a function selector containing the signal and feedback switches which has a good deal of distance between its contacts. Accordingly, a function selector of relatively large size is used and the freedom of design is limited. Also, the wiring layout is critical.

SUMMARY OF THE INVENTION

The invention disclosed herein uses feedback attenuation impedances connected between the feedback circuits and ground to prevent oscillations induced by positive feedback.

In the phono position, a phonograph signal is fed through switch contacts to a signal input of the amplifier. Negative feedback for pre-emphasis is provided by a feedback network which connects the amplifier output through a switch to a feedback input in the amplifier. The "tuner" feedback network is disconnected. However, leakage resistance between switch contacts in the function selector provides a positive feedback path through the disconnected circuit to the amplifier input. An attenuation impedance between the disconnected feedback network and ground shunts the positive feedback currents to ground and prevents oscillation.

Accordingly, an object of the present invention is to provide an amplifier with a plurality of negative feedback circuits free from the defects encountered in the prior art.

Another object of the present invention is to provide an amplifier with a plurality of negative feedback circuits which is protected from oscillation, and which does not require a large function switch with widely spaced contacts.

A further object of the invention is to provide an amplifier with switchable signal inputs and feedback circuits where careful internal wiring layout is not needed to prevent oscillation.

A further object of the present invention is to provide an amplifier with a plurality of negative feedback circuits which has a plurality of negative feedback circuits connected selectively to the amplifier for a given kind of input signal where the loop gain remains below a predetermined value, and the amplifier is free from oscillating.

The other objects, features and advantages of the present invention will be apparent from the following description taken in conjunction with the accompanying drawings.

BRIEF DESCRIPTION OF THE DRAWINGS

FIG. 1 is a circuit diagram showing an embodiment of the amplifier with a plurality of negative feedback circuits according to the present invention; and FIG. 2 is a graph used for explaining the embodiment shown in FIG. 1.

DESCRIPTION OF THE PREFERRED EMBODIMENT

An embodiment of the present invention will be now described with reference to the drawings.

In FIG. 1, reference numeral or symbol 1P indicates a phono input terminal which is supplied with an output signal from a phonograph (not shown). This signal is supplied to one selection contact $S_{1a}$ of a signal switch $S_1$ in a phono position.

Reference symbol 1T indicates a tuner input terminal which is supplied with an output signal from an FM tuner (not shown). This signal is applied to the other selection contact $S_{1b}$ of the signal switch $S_1$ in a tuner position.

The signal switch $S_1$ has a movable contact piece $S_{1m}$ which connects a main contact $S_{1c}$ of the signal switch $S_1$ with either selection contact $S_{1a}$ in the phono position or with the other selection contact $S_{1b}$ in the tuner position. Thus, either the output signal from the phonograph or the output signal from the FM tuner is supplied to an amplifier described below.

The signal applied to the main contact $S_{1c}$ of the signal switch $S_1$ is applied to a signal input terminal 6 of an amplifier 2. The signal input terminal 6 of the amplifier 2 is grounded through a resistor 3 which serves as a resistor for determining the input impedance of the amplifier 2. The output signal of the amplifier 2 present at its output terminal 4 is applied through negative feedback circuits $Z_{EQ}$ and $Z_F$ to selection contacts $S_{2a}$ and $S_{2b}$, respectively, of a feedback switch $S_2$.

The negative feedback circuit $Z_{EQ}$ is an impedance network for correcting the phonograph output signal in the amplifier 2 in accordance with the RIAA characteristics. It is generally formed of a series connection of resistors 8 and 9 in parallel with a series connection of capacitors 10, 11 and a resistor 12. A junction 13 between the resistors 8 and 9 is connected to a junction 14 between the capacitors 10 and 11.

The other negative feedback circuit $Z_F$ is an impedance network for creating a constant frequency response when amplifying the FM tuner output signal. It is generally formed of a parallel connection of a resistor 15 and a capacitor 16.

The feedback switch $S_2$ has a movable contact piece $S_{2m}$ which is ganged or mounted on the same wafer with the movable contact $S_{1m}$ of the signal switch $S_1$ in a function selector. The contact piece $S_{2m}$ connects a main contact $S_{2c}$ of the feedback switch $S_2$ with either the selection contact $S_{2a}$ in the phono position or $S_{2b}$ in the tuner position. Thus, the negative feedback circuits $Z_{EQ}$ and $Z_F$ are switched. The signal obtained at the main contact $S_{2c}$ of the feedback switch $S_2$ is negatively fed back to the amplifier 2 at its negative feedback input terminal 7.

When the phonograph output signal is amplified, the coordinated switches $S_1$ and $S_2$ forming a function selector are switched in the phono position such that their movable contact pieces $S_{1m}$ and $S_{2m}$ connect their main contacts $S_{1c}$ and $S_{2c}$ with the selection contacts $S_{1a}$ and $S_{2a}$ respectively, as shown in FIG. 1. The output signal from the phonograph then travels from the phono input terminal 1P to the signal input terminal 6 of the amplifier 2 through the signal switch $S_1$. Output from the amplifier 2 at the output terminal 4 travels through the negative phono feedback circuit $Z_{EQ}$ and feedback switch $S_2$ to feedback input terminal 7. This path has a gain-frequency characteristic such that its gain becomes a maximum of 60 dB at or near a frequency of 10 Hz and decreases gradually as the frequency becomes high, as shown in FIG. 2 by a curve $a$. This curve shows the pre-emphasis or so-called RIAA characteristic needed to compensate for the opposite frequency response used in cutting the record. Thus, the output signal from the phonograph is corrected and a signal which has a flat frequency characteristic is delivered at the output terminal 4.

When the output signal from the stereo or FM tuner is amplified, the switches $S_1$ and $S_2$ are switched such that their movable contact pieces $S_{1m}$ and $S_{2m}$ connect the main contacts $S_{1c}$ and $S_{2c}$ with the selection contacts $S_{1b}$ and $S_{2b}$, respectively. Thus, the output signal applied to the tuner input terminal 1T from the FM tuner is applied through the signal switch $S_1$ to the signal input terminal 6 of the amplifier 2. The amplified signal at the output terminal 4 of the amplifier 2 travels through the negative tuner feedback circuit $Z_F$ and the feedback switch $S_2$ to the negative feedback input terminal 7. This path shows a gain-frequency characteristic such that the gain becomes substantially constant at 40 dB for most audio frequencies to permit flat voltage amplification as shown in FIG. 2 by a curve $b$.

To prevent self-oscillation as described below, a feedback attenuation resistor $R_{EQ}$ is connected between the contact $S_{2a}$ of the feedback switch $S_2$ and ground. Also, a feedback attenuation resistor $R_F$ is connected between the contact $S_{2b}$ of the signal switch $S_2$ and ground.

Operation of the negative feedback type amplifier constructed above will first be explained where no feedback attenuation resistors $R_{EQ}$ and $R_F$ are provided. When the output signal from the phonograph is amplified and the main contacts $S_{1c}$ and $S_{2c}$ of the switches $S_1$ and $S_2$ are connected to their selection contacts $S_{1a}$ and $S_{2a}$ in the phono position, as shown in FIG. 1, the output signal from the amplifier 2 is negatively fed back through the phono feedback circuit $Z_{EQ}$ and the feedback switch $S_2$. Since a leakage resistance $R_r$ exists between the selection contact $S_{1a}$ of the signal switch $S_1$ and the selection contact $S_{2b}$ of the feedback switch $S_2$, the output signal from the amplifier 2 is positively fed back to its input terminal 6 through the leakage resistance $R_r$ and the signal switch $S_1$. If it is assumed that the gain of the amplifier 2 is taken as A (dB), its input impedance is taken as $Z_i$ (KΩ), and the leakage resistance as $R_r$ (KΩ), the following equation (1) is established:

$$A \geqq 20 \log \frac{Z_i + R_r}{Z_i} \qquad (1)$$

For values of A, $R_r$, and $Z_i$ which satisfy this equation, a loop gain of the system becomes larger than 1 and hence the amplifier begins to oscillate. When the negative phono feedback circuit $Z_{EQ}$ is used, a maximum gain of 60 dB is obtained as shown by the curve $a$ in FIG. 2. Thus, the following equation (2) is established:

$$60 \geqq 20 \log \frac{Z_i + R_r}{Z_i}$$

$$\therefore R_r \leqq 1,000 \, Z_i \qquad (2)$$

Therefore, if the leakage resistance $R_r$ is not greater than 1,000 times the input impedance $Z_i$, the amplifier may oscillate. In general, the input impedance of a typical amplifier is about 50 KΩ and hence the leakage resistance must be more than 50 MΩ. The leakage resistance between the contacts of an ordinary switch and between the patterns adjacent to the terminal plates is about 50 to 100 MΩ at room temperatures and ordinary moisture, but becomes about 10 MΩ at high temperature and high moisture. Thus, scattered oscillations can occur at room temperatures and can become more serious at high temperatures and moisture.

With the present invention, the connection point between the selection contact $S_{2b}$ of the feedback switch $S_2$ and the negative feedback circuit $Z_F$ is grounded through the feedback attenuation resistor $R_F$. The resistor $R_F$ is selected to have the resistance value such that the loop gain is smaller than 1. In other words, if the positive feedback loop comprising the amplifier 2, the negative feedback circuit $Z_F$, the leakage resistance $R_r$, and the amplifier 2 is subjected to high temperature and moisture, the resistance $R_r$ becomes about 10 MΩ and the circuit oscillates. The oscillation margin $M_{EQ}$ is expressed as follows:

$$M_{EQ} = 20 \log \frac{Z_i + R_r}{Z_i} - A$$

$$** \; 46 - 60 = -14 \; (dB) \qquad (3)$$

(where $R_r = 10$ MΩ, $Z_i = 50$ KΩ, A = 60 dB).

Thus, if the loop gain is lowered by an amount greater than 14 dB, the amplifier is prevented from oscillating. Therefore, if the impedance of the tuner feedback circuit $Z_F$ is 20 KΩ at the frequency where the maximum gain of 60 dB is obtained, and the resistance of the resistor $R_F$ is selected as 2.5 KΩ, the loop gain is lowered (20 log 2.5/2.5 + 20 ≈ − 20 (dB)), by 20 dB and the oscillation margin becomes + 6 dB (the loop gain becomes − 6 dB). Thus, the amplifier is prevented from oscillating.

When the output signal from the FM tuner is amplified, the switches $S_1$ and $S_2$ are switched to the tuner position such that their movable contact pieces $S_{1m}$ and $S_{2m}$ connect the main contacts $S_{1c}$ and $S_{2c}$ with the selection contacts $S_{1b}$ and $S_{2b}$, respectively. As shown in FIG. 2, the maximum gain of the amplifier with feedback $Z_F$ is about 40 dB. The oscillation margin $M_F$ is expressed by the following expression (4) if the leakage resistance between the contacts $S_{2a}$ and $S_{1c}$ (not shown in the drawings) is taken as 10 MΩ:

$$M_F = 20 \log \frac{Z_i + R_r}{Z_i} - A$$
$$= 46 - 40$$
$$= 6 \ (dB) \qquad (4)$$

(where $Z_i = 50$ KΩ, $R_r = 10$ MΩ, $A = 40$ dB).

Since $M_F$ is positive, there is no oscillation. However, if the oscillation margin $M_F$ is small or becomes negative, the junction between the selection contact $S_{2a}$ of the feedback switch $S_2$ and the negative feedback circuit $Z_{EQ}$ is grounded through the feedback attenuation resistor $R_{EQ}$ and the resistance value thereof is selected as described above to make the loop gain smaller than 1. Thus, the oscillation is prevented, since the positive feedback through $Z_{EQ}$ is attenuated.

As described above, the amplifier of the present invention is provided with a plurality of negative feedback circuits which are selectively connected by a switch with the amplifier. Since one of the feedback circuits is opened, a positive feedback path is created between the open terminal of that feedback circuit and the amplifier signal input 6 through the leakage resistance between terminals of the switches $S_1$ and $S_2$. To prevent this positive feedback from causing oscillations, a feedback attenuation resistor is provided between the open feedback circuit terminal and ground to make the loop gain of the amplifier smaller than 1 (by shunting the feedback currents to ground rather than through the leakage resistance). Thus, ganged switches of small size can be used.

An additional advantage of this invention is the decreased sensitivity of the system to wiring layouts; wirings of the amplifier can be easily carried out which might cause oscillation of the amplifier.

Although the preferred embodiment was described in terms of switchable feedback circuits for phonographs and tuners, it should be understood that the invention is applicable to any circuits having switchable inputs and switchable feedback paths which are switched in coordination.

I claim as my invention:

1. An amplifier with a plurality of negative feedback circuits comprising:
   a. an amplifier having an input terminal, a negative feedback terminal and an output terminal, said input terminal having a switching means connected thereto to selectively supply one of a plurality of input signals to the input terminal;
   b. a plurality of negative feedback circuits selectively connected between said negative feedback terminal and said output terminal said selection being performed by said switching means connected between said negative feedback terminal and each of said feedback circuits, said switching means having leakage resistance between said input terminal connection and at least one of said feedback circuits; and
   c. impedance means provided in at least one of said plurality of negative feedback circuits, each impedance means having a predetermined resistance sufficient to prevent positive feedback oscillation of said amplifier through said switching means leakage resistance when at least one of said feedback circuits is not switched in.

2. An amplifier with a plurality of negative feedback circuits according to claim 1, wherein said plurality of negative feedback circuits comprises first and second impedance networks in which said impedance means is provided between each feedback circuit connection to the switching means and a reference point.

3. An amplifier with a plurality of negative feedback circuits according to claim 2, wherein said first impedance network has a non-flat frequency response and said second impedance network has a flat frequency response.

4. An amplifier with a plurality of negative feedback circuits according to claim 3, wherein said impedance means comprises a resistor.

5. An amplifier with a plurality of negative feedback circuits according to claim 4, wherein said first impedance network comprises a series connection of resistors and a series connection of capacitors and a resistor, both the series connections being connected in parallel with each other, and said second impedance network comprises a resistor and a capacitor which are connected in parallel with each other.

6. An amplifier comprising: a signal input terminal, a negative feedback input terminal, and an output terminal; a function selector having first and second coordinated switches with leakage resistance paths therebetween; a plurality of negative feedback circuits; and impedance means; one end of each of said feedback circuits being connected to the output terminal of said amplifier and another end of each feedback circuit being switchably connected by said function selector to said negative feedback input terminal of said amplifier, said signal input terminal being switchably connected to one of a plurality of input signals by said function selector, and said impedance means being provided in at least one of said plurality of negative feedback circuits between the output of said feedback circuit and ground so as to prevent oscillation of said amplifier by a positive feedback to said input terminal through one of said function selector leakage resistances when at least one of said feedback circuits is not switched in.

7. An amplifier, feedback circuit, function selector, and impedance means as claimed in claim 6, wherein said impedance means is provided in only one of said feedback circuits.

8. An amplifier, feedback circuit, function selector, and impedance means as claimed in claim 6, wherein said impedance means is provided in all of said feedback circuits.

9. An amplifier, feedback circuit, function selector, and impedance means as claimed in claim 6, wherein said impedance means is an attenuation resistor connected between the switchable end of said feedback circuit and ground.

* * * * *